United States Patent
Mizushiro (10) Patent No.: US 9,591,769 B2
(45) Date of Patent: Mar. 7, 2017

(54) MODULE AND METHOD FOR MANUFACTURING THE SAME

(71) Applicant: Murata Manufacturing Co., Ltd., Kyoto-fu (JP)

(72) Inventor: Masaaki Mizushiro, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 236 days.

(21) Appl. No.: 14/223,235

(22) Filed: Mar. 24, 2014

(65) Prior Publication Data

US 2014/0347822 A1    Nov. 27, 2014

(30) Foreign Application Priority Data

May 21, 2013    (JP) .................................. 2013-107010

(51) Int. Cl.
*H05K 1/18*    (2006.01)
*H05K 3/34*    (2006.01)
(Continued)

(52) U.S. Cl.
CPC ......... *H05K 3/3494* (2013.01); *H05K 3/3452* (2013.01); *H01L 2224/16225* (2013.01);
(Continued)

(58) Field of Classification Search
CPC ........ H05K 3/243; H05K 3/244; H05K 3/284; H05K 3/3452; H05K 3/3494; H05K 2201/099; H05K 2203/1105
See application file for complete search history.

(56) References Cited

U.S. PATENT DOCUMENTS 6,228,466 B1    5/2001    Tsukada et al.
8,344,265 B2 *  1/2013    Oda .................... H01L 23/3121
                                                                174/260
(Continued)

FOREIGN PATENT DOCUMENTS

CN    1938839 A    3/2007
JP    H11-054896 A    2/1999
(Continued)

OTHER PUBLICATIONS

Office action issued in KR10-2014-0027726 issued Apr. 22, 2015.

*Primary Examiner* — Courtney Smith
*Assistant Examiner* — Jessey R Ervin
(74) *Attorney, Agent, or Firm* — Pearne & Gordon LLP (57) ABSTRACT

A module includes a wiring board; a plurality of mounting electrodes for component mounting, the mounting electrodes being disposed on one principal surface of the wiring board; a plurality of components mounted on the one principal surface of the wiring board and solder-connected to the mounting electrodes; a solder resist being a photosensitive resin configured to cover the one principal surface of the wiring board, with a plating electrode layer of each mounting electrode exposed; and a sealing resin layer disposed on the one principal surface of the wiring board, the sealing resin layer being configured to cover the photosensitive resin and the components connected to the mounting electrodes. A recess substantially wedge-shaped in cross section is provided at a boundary between the plating electrode layer of each mounting electrode and the solder resist, and the recess is filled with resin of the sealing resin layer.

8 Claims, 10 Drawing Sheets

(51) Int. Cl.
　　　*H05K 3/24*　　　(2006.01)
　　　*H05K 3/28*　　　(2006.01)

(52) U.S. Cl.
　　　CPC .... *H01L 2924/19105* (2013.01); *H05K 1/185* (2013.01); *H05K 3/243* (2013.01); *H05K 3/244* (2013.01); *H05K 3/284* (2013.01); *H05K 2201/099* (2013.01); *H05K 2203/1105* (2013.01); *Y10T 29/49144* (2015.01)

(56) References Cited

U.S. PATENT DOCUMENTS

| | | | |
|---|---|---|---|
| 2003/0132025 A1* | 7/2003 | Wakihara | H05K 1/0269 174/256 |
| 2008/0179740 A1 | 7/2008 | Liao | |
| 2008/0251942 A1* | 10/2008 | Ohuchi | H01L 21/563 257/778 |

FOREIGN PATENT DOCUMENTS

| | | |
|---|---|---|
| JP | 2003-229450 A | 8/2003 |
| JP | 2005-183430 A | 7/2005 |
| KR | 10-2007-00691452 A | 7/2007 |
| WO | 2007-004660 A1 | 1/2007 |

\* cited by examiner

MODULE AND METHOD FOR MANUFACTURING THE SAME

BACKGROUND OF THE INVENTION

1. Field of the Invention

The present invention relates to a module in which components are mounted on a wiring board and the components are covered with sealing resin, and also relates to a method for manufacturing the module.

2. Description of the Related Art

A module has been known, in which components are mounted on a wiring board using solder. In this type of module, a protective film, such as a solder resist which is a photosensitive resin, is disposed on a principal surface of the wiring board to protect wiring electrodes on the surface of the wiring board. At the same time, to protect the components mounted on the wiring board, the solder resist and the components are covered with sealing resin. In such a module structure, moisture penetrating into an interface between the solder resist and the sealing resin and into an interface between the solder resist and the wiring board turns to vapor when the module is mounted on an external motherboard or the like. The resulting expansion force of the vapor may create gaps in the interfaces, and this causes so-called solder splashes. That is, the solder that connects the components and the wiring board is remelted by heat produced when the module is mounted on the motherboard, flows into the gaps in the interfaces, and causes adjacent components to be short-circuited.

Figure 10:
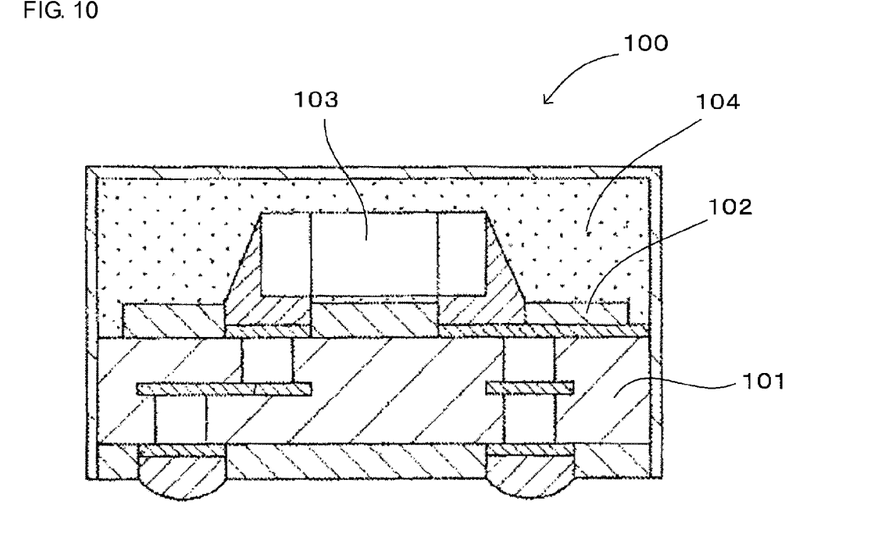
FIG. 10 is a cross-sectional view of a module of related art.

Japanese Unexamined Patent Application Publication No. 2005-183430 (see, e.g., paragraphs [0030] to [0040], FIG. 1) discloses a module designed to prevent solder splashes. In this module 100, as illustrated in FIG. 10, a part of a solder resist 102, the part being located on an outer region of one principal surface of a wiring board 101, is removed. Then, a component 103 mounted on the wiring board 101, the solder resist 102, and the outer region of the one principal surface of the wiring board 101 exposed by partially removing the solder resist 102 are covered by a sealing resin layer 104. The adhesion between the sealing resin layer 104 and the wiring board 101 is known to be greater than that between the solder resist 102 and the wiring board 101. When the part of the solder resist 102 on the outer region of the wiring board 101 is removed and the exposed outer region of the wiring board 101 is covered by the sealing resin layer 104, it is possible to prevent penetration of moisture from outside the module 100, and enhance the adhesion between the sealing resin layer 104 and the wiring board 101. Therefore, it is possible to prevent a creation of a gap, which may cause solder splashes, from being created in the interface between the wiring board 101 and the sealing resin layer 104.

However, even with the structure of the module 100 described above, moisture may penetrate into the interface between the wiring board 101 and the sealing resin layer 104, and this may create a gap in this interface when the module 100 is mounted on the motherboard. Then, the expansion force that is produced when the moisture turns into vapor is transmitted to the interface between the solder resist 102 and the sealing resin layer 104, and creates a gap in the interface between the solder resist 102 and the sealing resin layer 104. A difference in coefficient of linear expansion between the sealing resin layer 104 and the solder resist 102 may cause interfacial peeling and a gap between them, and may result in solder splashes.

BRIEF SUMMARY OF THE INVENTION

The present invention has been made in view of the problems described above. An object of the present invention is to provide a module that can prevent solder for connection between a component and a wiring board from flowing into a gap between a photosensitive resin and a sealing resin layer, and can prevent adjacent mounting electrodes from being short-circuited.

To achieve the object described above, a module according to preferred embodiments of the present invention includes a wiring board; a mounting electrode for component mounting, the mounting electrode being disposed on one principal surface of the wiring board; a component mounted on the one principal surface of the wiring board and solder-connected to the mounting electrode; a photosensitive resin configured to cover the one principal surface of the wiring board, with at least a connection surface of the mounting electrode exposed, the connection surface being connected to the component; and a sealing resin layer disposed on the one principal surface of the wiring board, the sealing resin layer being configured to cover the photosensitive resin and the component connected to the mounting electrode. A recess substantially wedge-shaped in cross section is provided at a boundary between the mounting electrode and the photosensitive resin, and the recess is filled with resin of the sealing resin layer.

As described above, the module has a recess substantially wedge-shaped in cross section at the boundary between the mounting electrode for component mounting and the photosensitive resin, and the recess is filled with resin of the sealing resin layer. Filling the recess with resin of the sealing resin layer provides an anchor effect, which improves an adhesion strength between the sealing resin layer and the photosensitive resin at the recess. This can prevent moisture from penetrating into the interface between the sealing resin layer and the photosensitive resin. Therefore, it is possible to reduce creation of a gap in the interface between the sealing resin layer and the photosensitive resin when the module is mounted on an external motherboard or the like. Even if a gap is created in the interface described above, since a path of the gap that connects adjacent mounting electrodes is not straight and is elongated because the path has the recess which is substantially wedge-shaped, it is possible to prevent melted solder from flowing from one mounting electrode to the adjacent mounting electrode and causing these mounting electrodes to be short-circuited. Additionally, since the path of the gap between the photosensitive resin and the sealing resin layer is substantially V-shaped at the recess, it can be expected that the flow of the melted solder in the path of the gap will be stopped at the recess.

The mounting electrode may have a two-layer structure including a surface electrode layer disposed on the wiring board and a plating electrode layer stacked on the surface electrode layer. For example, when the surface electrode layer is a Cu layer and the plating electrode layer is an Ni/Au layer, the surface electrode layer can be prevented from being oxidized or corroded by the plating electrode layer. Also, since an inter-diffusion coefficient between the Ni/Au layer and the solder is higher than that of between the Ni/Au layer and the Cu layer, wettability of the solder on the mounting electrode is improved.

As viewed in a direction orthogonal to the one principal surface, an area of the plating electrode layer may be smaller than an area of the surface electrode layer, and the recess may be provided at a boundary between the plating electrode layer and the photosensitive resin. As described, the mounting electrode may include the surface electrode layer and the plating electrode layer having an area smaller than that of the surface electrode layer as viewed in a direction orthogonal to the one principal surface of the wiring board. Even in this case, since the recess substantially wedge-shaped in cross section is provided at the boundary between the plating electrode layer and the photosensitive resin, an anchor effect achieved by the presence of the recess improves an adhesion strength of the interface between the photosensitive resin and the sealing resin layer. Therefore, a gap, which may cause solder splashes, can be prevented from being created in the interface. Even if a gap is created in the interface between the photosensitive resin and the sealing resin layer, since a path of the gap that connects adjacent mounting electrodes is elongated, it is possible to prevent solder splashes.

The plating electrode layer may cover an outer surface of the surface electrode layer, except a surface in contact with the wiring board. Even with this configuration, since the recess substantially wedge-shaped in cross section is provided at the boundary between the plating electrode layer and the photosensitive resin, it is possible to prevent solder splashes.

A surface of the mounting electrode may be coated with a solder film. Thus, since the recess substantially wedge-shaped in cross section is provided at a boundary between the solder film and the photosensitive resin, it is possible again to prevent solder splashes.

A surface of the photosensitive resin may be roughened. Roughening the surface of the photosensitive resin further improves the adhesion strength between the photosensitive resin and the sealing resin layer, and thus further improves the effect of preventing solder splashes.

The wiring board may be any one of a resin substrate, a glass epoxy resin substrate, and a ceramic substrate. This is practical because a commonly used substrate can be used as the wiring board. The photosensitive resin may be a solder resist. In this case, the solder resist can be used as the photosensitive resin.

A module manufacturing method according to preferred embodiments of the present invention includes preparing a wiring board; forming a surface electrode layer on one principal surface of the wiring board, the surface electrode layer being a layer of a mounting electrode for component mounting; forming a photosensitive resin on the one principal surface of the wiring board, the photosensitive resin having an opening on the surface electrode layer; forming a plating electrode layer of the mounting electrode in the opening; forming a gap at a boundary between the photosensitive resin and the plating electrode layer by condensing the photosensitive resin through heat treatment; applying solder to a surface of the plating electrode layer of the mounting electrode; mounting a component on the mounting electrode on the wiring board; forming a recess substantially wedge-shaped in cross section in the gap between the photosensitive resin and the plating electrode layer by performing reflow heat treatment to solder-connect the component to the mounting electrode and soften the photosensitive resin; and forming a sealing resin layer by covering the component mounted on the mounting electrode and the photosensitive resin with sealing resin, and filling the recess with the sealing resin.

In this case, after the photosensitive resin is condensed by heat treatment and a gap is formed at the boundary between the photosensitive resin and the plating electrode layer of the mounting electrode, a recess substantially wedge-shaped in cross section is formed in the gap between the photosensitive resin and the plating electrode layer by performing reflow heat treatment to solder-connect the component to the mounting electrode and soften the photosensitive resin. It is thus possible to manufacture a module that has a recess substantially wedge-shaped in cross section at the boundary between the mounting electrode and the photosensitive resin, and is capable of preventing solder splashes.

Another module manufacturing method according to preferred embodiments of the present invention includes preparing a wiring board; forming a surface electrode layer on one principal surface of the wiring board, the surface electrode layer being a layer of a mounting electrode for component mounting; forming a negative photosensitive resin on the one principal surface of the wiring board; performing patterning exposure, on the photosensitive resin, for forming a plating electrode layer of the mounting electrode on the surface electrode layer by an amount of light exposure smaller than an amount of light exposure at which the photosensitive resin fully reacts to light; forming an opening in a region of the photosensitive resin, the region being located on the surface electrode layer, by performing development and after-baking; forming the plating electrode layer in the opening; applying solder to a surface of the plating electrode layer of the mounting electrode; mounting a component on the mounting electrode on the wiring board; forming a recess substantially wedge-shaped in cross section at a boundary between the photosensitive resin and the plating electrode layer by performing heat treatment to solder-connect the component to the mounting electrode and soften an unreacted part of the photosensitive resin, the unreacted part being a part not having reacted to light in the patterning exposure; removing the unreacted part of the photosensitive resin by wet or dry cleaning treatment; and forming a sealing resin layer by covering the component mounted on the mounting electrode and the photosensitive resin with sealing resin, and filling the recess with the sealing resin.

In this case, patterning exposure for forming the plating electrode layer to be stacked on the surface electrode layer is performed on the negative photosensitive resin by an amount of light exposure smaller than an amount of light exposure at which the photosensitive resin fully reacts to light. Then, a recess substantially wedge-shaped in cross section is formed at a boundary between the photosensitive resin and the plating electrode layer by performing heat treatment to solder-connect the component to the mounting electrode and soften an unreacted part of the photosensitive resin, the unreacted part being a part not having reacted to light in the patterning exposure. A module can thus be manufactured, which has a recess substantially wedge-shaped in cross section at the boundary between the mounting electrode and the photosensitive resin. Therefore, it is possible to manufacture a module capable of preventing solder splashes.

The module manufacturing method may further include roughening a surface of the photosensitive resin by plasma treatment after the photosensitive resin is formed on the one principal surface of the wiring board. Since this improves the adhesion strength between the photosensitive resin and the sealing resin layer, it is possible to manufacture a module capable of more effectively preventing solder splashes.

According to preferred embodiments of the present invention, the module has a recess substantially wedge-shaped in cross section at the boundary between the mounting electrode for component mounting and the photosensitive resin, and the recess is filled with resin of the sealing resin layer. Filling the recess with resin of the sealing resin layer provides an anchor effect, which improves the adhesion strength between the sealing resin layer and the photosensitive resin at the recess. This can prevent moisture from penetrating into the interface between the sealing resin layer and the photosensitive resin. Therefore, it is possible to prevent a gap from being created in the interface between the sealing resin layer and the photosensitive resin when the module is mounted on an external motherboard or the like. Even if a gap is created in the interface described above, since a path of the gap that connects adjacent mounting electrodes is not straight and is elongated because the path has the recess which is substantially wedge-shaped, it is possible to prevent melted solder from flowing from one mounting electrode to the adjacent mounting electrode and causing these mounting electrodes to be short-circuited.

Other features, elements, characteristics and advantages of the present invention will become more apparent from the following detailed description of preferred embodiments of the present invention with reference to the attached drawings.

DETAILED DESCRIPTION OF THE INVENTION

First Embodiment

Figure 1:
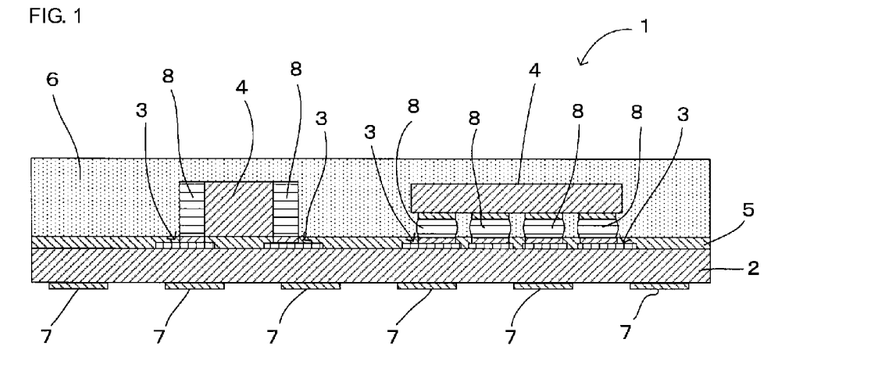
FIG. 1 is a cross-sectional view of a module according to a first embodiment of the present invention.

A module 1 according to a first embodiment of the present invention will be described with reference to FIG. 1 and FIG. 2. FIG. 1 is a cross-sectional view of the module 1 according to the first embodiment, and FIG. 2 is a partial cross-sectional enlarged view of the module 1.

As illustrated in FIG. 1, the module 1 according to the first embodiment includes a wiring board 2, a plurality of mounting electrodes 3 disposed on one principal surface of the wiring board 2, a plurality of components 4 mounted on the one principal surface of the wiring board 2 and each solder-connected to predetermined ones of the mounting electrodes 3, a solder resist 5 configured to cover the one principal surface of the wiring board 2 and serving as an example of a photosensitive resin, and a sealing resin layer 6 configured to cover the components 4 and the solder resist 5. For example, the module 1 is mounted on a motherboard of an electronic device, such as a cellular phone.

The wiring board 2 is a multi-layer substrate formed by stacking a plurality of insulating layers made of an insulating material, such as glass epoxy resin or low temperature co-fired ceramic (LTCC). As described above, the mounting electrodes 3 are disposed on the one principal surface of the wiring board 2. The wiring board 2 is internally provided with via conductors (not shown) and various wiring electrodes (not shown). A plurality of outer electrodes 7 for external connection are disposed on the other principal surface of the wiring board 2. The wiring board 2 may be a single-layer substrate.

Figure 2:
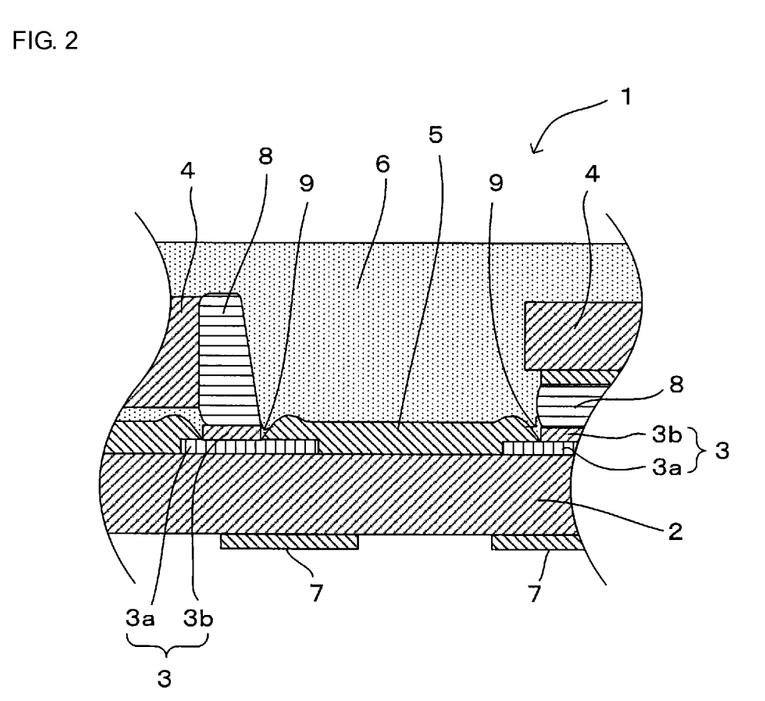
FIG. 2 is a partial cross-sectional view of the module illustrated in FIG. 1.

As illustrated in FIG. 1 and FIG. 2, each of the mounting electrodes 3 has a two-layer structure of a surface electrode layer 3a disposed on the one principal surface of the wiring board 2 and a plating electrode layer 3b stacked on the surface electrode layer 3a. As viewed in a direction orthogonal to the one principal surface of the wiring board 2, an area of the plating electrode layer 3b is smaller than an area of the surface electrode layer 3a. In the first embodiment, the surface electrode layer 3a is made of Cu, and the plating electrode layer 3b is made of Ni/Au plating.

Each of the components 4 is an integrated circuit (IC) which is a semiconductor element made of Si or GaAs, or a chip component such as a chip capacitor or a chip inductor. The components 4 are mounted on the one principal surface of the wiring board 2 using known surface mount technology. Terminals of each of the components 4 are connected by solder 8 to predetermined ones of the mounting electrodes 3.

The solder resist 5 covers the one principal surface of the wiring board 2, with at least a connection surface of each mounting electrode 3 exposed, the connection surface being connected to the corresponding component 4. At a boundary between each mounting electrode 3 and the solder resist 5, a recess 9 substantially wedge-shaped in cross section is provided at a position close to the connection surface of the mounting electrode 3. As illustrated in FIG. 2, the recess 9 is substantially wedge-shaped in cross section, as viewed in a direction parallel to the one principal surface of the wiring board 2. The solder resist 5 covers the one principal surface of the wiring board 2 and a part of a surface of the surface electrode layer 3a, the part being not in contact with the plating electrode layer 3b. Thus, the recess 9 substantially wedge-shaped in cross section is provided at the boundary between the plating electrode layer 3b and the solder resist 5. A photosensitive resin, such as a photosensitive polyimide, may be used instead of the solder resist 5.

The sealing resin layer 6 is made of, for example, epoxy resin. The sealing resin layer 6 covers the solder resist 5 and the components 4 mounted on the one principal surface of the wiring board 2. The recess 9 described above is filled with resin (corresponding to sealing resin of the present invention) of the sealing resin layer 6.

(First Method for Manufacturing the Module 1)

A method for manufacturing the module 1 will now be described with reference to FIGS. 3A to 3D and FIGS. 4A and 4B. FIGS. 3A to 3D and FIGS. 4A and 4B illustrate a method for manufacturing the module 1, and are each a partial cross-sectional view of the module 1. FIGS. 3A to 3D illustrate steps of the manufacturing method, and FIGS. 4A and 4B illustrate steps that follow the step illustrated in FIG. 3D.

First, the wiring board 2 internally provided with via conductors and various wiring electrodes is prepared. The plurality of surface electrode layers 3a of the mounting electrodes 3 for component mounting are formed on one principal surface of the wiring board 2, and the plurality of outer electrodes 7 for external connection are formed on the other principal surface of the wiring board 2. The surface electrode layers 3a are formed, for example, by a printing technique using a conductive paste containing Cu, or by pattern etching using a photolithographic technique. The surface electrode layers 3a and the outer electrodes 7 may be formed when the insulating layers of the wiring board 2 are in a separate state before being stacked together.

Figure 3A:
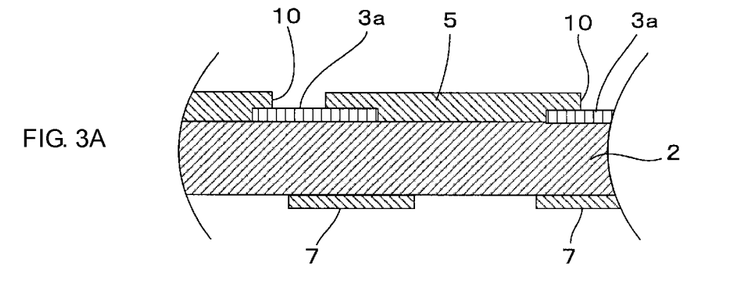
FIGS. 3A to 3D illustrate a method for manufacturing the module illustrated in FIG. 1.
Figure 4A:
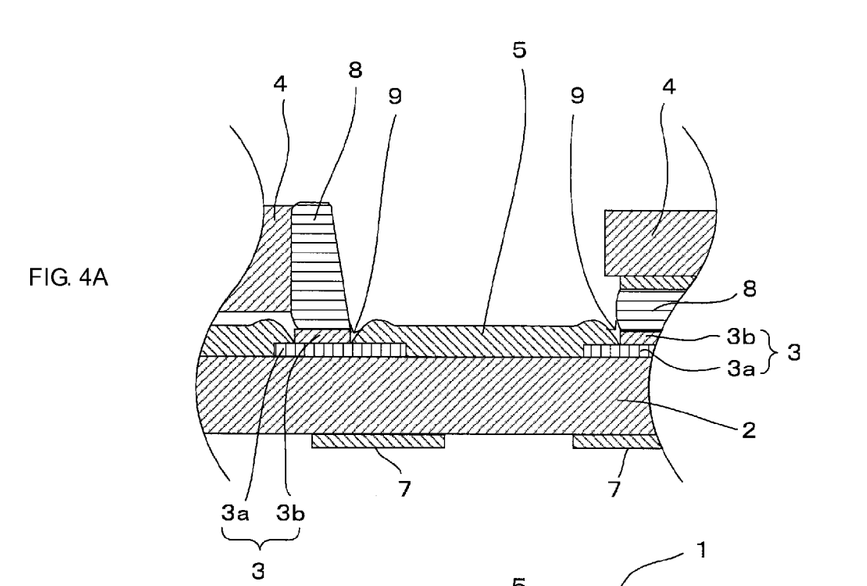
FIGS. 4A and 4B also illustrate the method for manufacturing the module illustrated in FIG. 1.
Figure 4B:
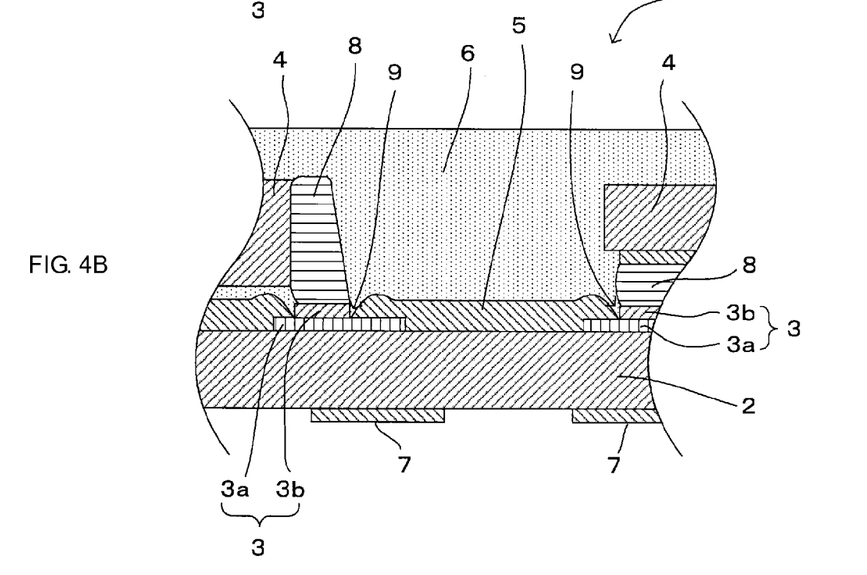

Next, as illustrated in FIG. 3A, the solder resist 5 having openings 10 on the respective surface electrode layers 3a is formed on the one principal surface of the wiring board 2. For example, the solder resist 5 is formed over the entire one principal surface of the wiring board 2 using a printing technique. Then, parts of the solder resist 5, the parts being located on the respective surface electrode layers 3a are removed using a photolithographic technique to form the openings 10.

Figure 3B:
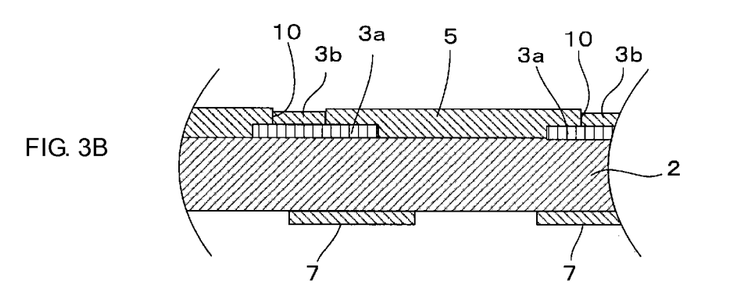

Next, as illustrated in FIG. 3B, the plating electrode layers 3b of the mounting electrodes 3 are formed in the respective openings 10 of the solder resist 5. Specifically, after an Ni film is formed by electroless plating on each surface electrode layer 3a exposed from the opening 10, an Au film is also formed by electroless plating on the Ni film, so that the plating electrode layer 3b formed by the Ni/Au film is stacked on the surface electrode layer 3a.

Figure 3C:
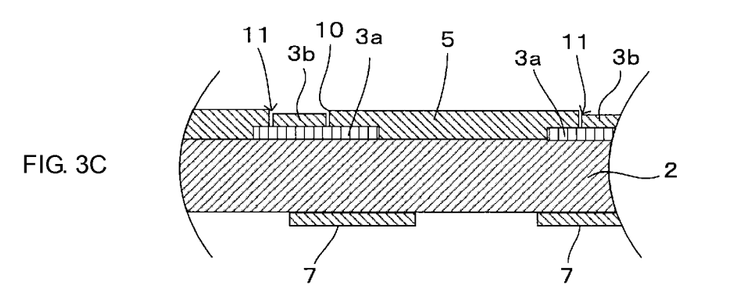

Next, as illustrated in FIG. 3C, a gap 11 is formed at a boundary between the solder resist 5 and each plating electrode layer 3b by increasing the degree of cure of the solder resist 5 and condensing the solder resist 5 through heat treatment. Since the plating electrode layers 3b and the solder resist 5 adhere to each other when the plating electrode layers 3b are formed, the heat treatment is performed for interfacial peeling between the plating electrode layers 3b and the solder resist 5. The heat treatment is preferably performed at about 10° C. or more for about 30 minutes or more.

Figure 3D:
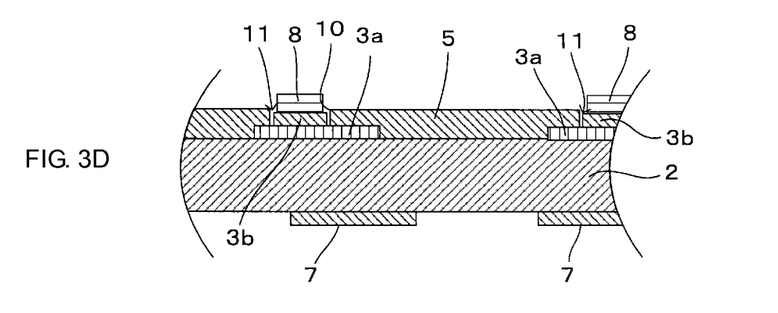

Next, as illustrated in FIG. 3D, the solder 8 is applied to the surfaces of the respective plating electrode layers 3b using a printing technique or the like, and each component 4 is mounted on predetermined mounting electrodes 3 on the wiring board 2 by using, for example, a component mounting device.

Next, as illustrated in FIG. 4A, the recess 9 substantially wedge-shaped in cross section is formed in the gap 11 between the solder resist 5 and each plating electrode layer 3b by performing heat treatment using a reflow oven or the like to solder-connect each component 4 to predetermined mounting electrodes 3 and soften the solder resist 5. A temperature of the reflow oven is set to be higher than or equal to a glass transition temperature (e.g., from about 200° C. to about 230° C.) which is a temperature at which the solder resist 5 is softened. This makes the slope of the inner wall of each opening 10 of the solder resist 5 gentler, and forms the recess 9 substantially wedge-shaped in cross section in the gap 11 described above.

Next, organic substances, such as flux residues, are washed off by wet or dry cleaning treatment. Examples of the wet cleaning treatment include cleaning performed using a cleaning solvent containing an organic solvent. Examples of the dry cleaning treatment include plasma cleaning.

Last, as illustrated in FIG. 4B, the components 4 and the solder resist 5 are covered, for example, with epoxy resin, and the recesses 9 are filled with the epoxy resin to form the sealing resin layer 6 and thus to manufacture the module 1. The sealing resin layer 6 may be formed, for example, by material application, printing, compression molding, or transfer molding.

After the solder resist 5 is formed, the surface of the solder resist 5 may be roughened by plasma treatment (plasma ashing). This further improves the adhesion strength between the solder resist 5 and the sealing resin layer 6, and makes it possible to more effectively prevent solder splashes. Examples of the plasma treatment include oxygen plasma treatment and argon plasma treatment.

In the first embodiment described above, the module 1 has the recess 9 substantially wedge-shaped in cross section at the boundary between the plating electrode layer 3b of each mounting electrode 3 and the solder resist 5, and the recess 9 is filled with resin of the sealing resin layer 6. Filling the recess 9 with resin of the sealing resin layer 6 provides an anchor effect, which improves an adhesion strength between the sealing resin layer 6 and the solder resist 5 at the recess 9. This can prevent moisture from penetrating into the interface between the sealing resin layer 6 and the solder resist 5. Therefore, it is possible to prevent a gap from being created in the interface between the sealing resin layer 6 and the solder resist 5 when the module 1 is mounted on an external motherboard or the like. Even if a gap is created in the interface between the sealing resin layer 6 and the solder resist 5, since a path of the gap that connects adjacent mounting electrodes 3 is not straight and is elongated because the path of the gap is substantially V-shaped at the recess 9, it is possible to prevent melted solder 8 from flowing from one mounting electrode 3 to the adjacent mounting electrode 3 and causing these mounting electrodes 3 to be short-circuited. Additionally, since the path of the gap is substantially V-shaped at the recess 9, it can be expected that the flow of the melted solder 8 in the path of the gap will be stopped at the recess 9.

Each surface electrode layer 3a is made of Cu and each plating electrode layer 3b is formed by an Ni/Au film. Therefore, the surface electrode layer 3a can be prevented from being oxidized or corroded by the plating electrode layer 3b. Also, since an inter-diffusion coefficient between the Ni/Au film and the solder 8 is higher than that between the Ni/Au film and Cu, wettability of the solder 8 on the mounting electrodes 3 can be improved.

In the method for manufacturing the module 1 described above, the gap 11 is created between the solder resist 5 and the plating electrode layer 3b of each mounting electrode 3 by condensing the solder resist 5 through heat treatment, and then the recess 9 substantially wedge-shaped in cross section is formed in the gap 11 between the solder resist 5 and the plating electrode layer 3b by heat treatment using a reflow oven or the like. It is thus possible to manufacture the module 1 that can prevent solder splashes.

Second Embodiment

The module 1 according to a second embodiment of the present invention will be described with reference to FIGS. 5A to 5E and FIGS. 6A to 6C. FIGS. 5A to 5E and FIGS. 6A to 6C illustrate a method for manufacturing the module 1, and are each a partial cross-sectional view of the module 1. FIGS. 5A to 5E illustrate steps of the manufacturing method, and FIGS. 6A to 6C illustrate steps that follow the step illustrated in FIG. 5E.

The module 1 according to the second embodiment differs from the module 1 of the first embodiment described with reference to FIG. 1 to FIGS. 4A and 4B in terms of the manufacturing method. The other configurations are the same as those of the module 1 of the first embodiment, and their description will be omitted by assigning the same reference numerals to the corresponding components. The manufacturing method will now be described.

(Second Method for Manufacturing the Module 1)

First, the wiring board 2 internally provided with via conductors and various wiring electrodes is prepared. The plurality of surface electrode layers 3a of the mounting electrodes 3 for component mounting are formed on one principal surface of the wiring board 2, and the plurality of outer electrodes 7 for external connection are formed on the other principal surface of the wiring board 2. The surface electrode layers 3a are formed, for example, by a printing technique using a conductive paste containing Cu, or by pattern etching using a photolithographic technique. The surface electrode layers 3a and the outer electrodes 7 may be formed when the insulating layers of the wiring board 2 are in a separate state before being stacked together.

Figure 5A:
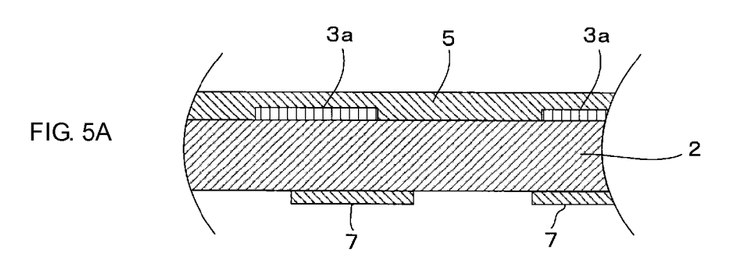
FIGS. 5A to 5E illustrate a method for manufacturing a module according to a second embodiment of the present invention.
Figure 5B:
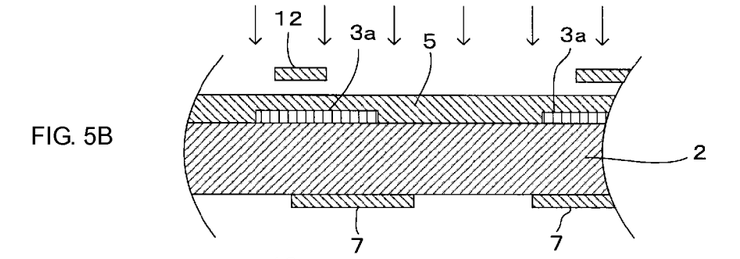
Figure 6A:
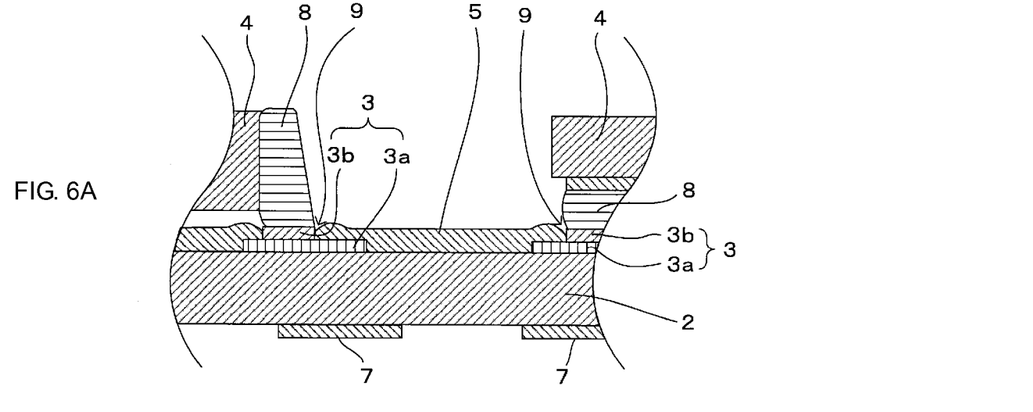
FIGS. 6A to 6C also illustrate the method for manufacturing the module according to the second embodiment of the present invention.
Figure 6B:
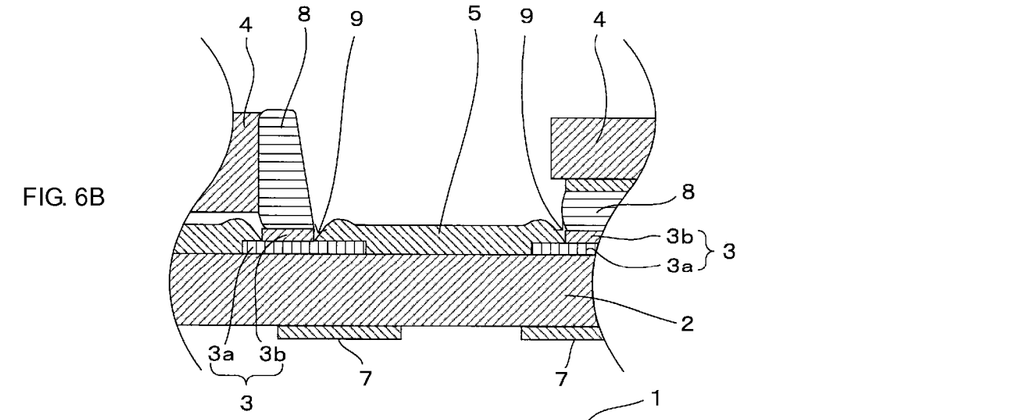
Figure 6C:
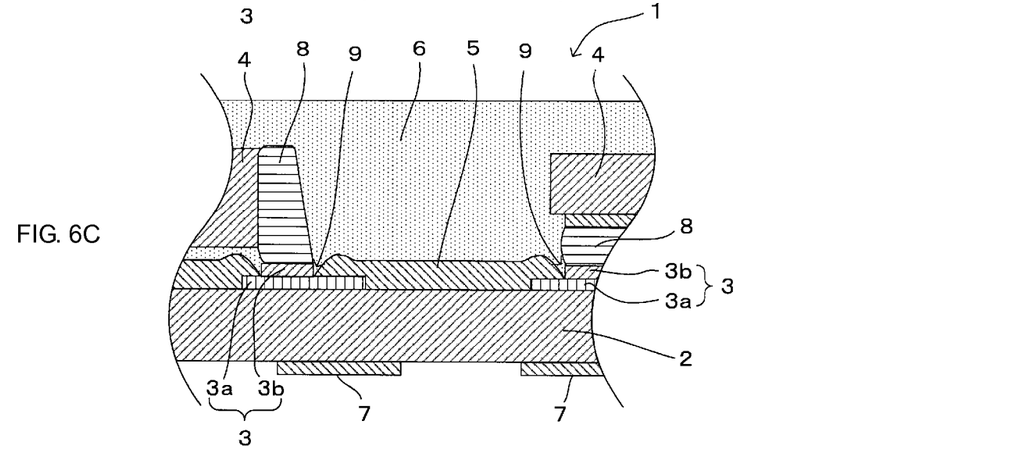

Next, as illustrated in FIG. 5A, the solder resist 5 of negative type is formed over the entire one principal surface of the wiring board 2 using a printing technique or the like. Then, as illustrated in FIG. 5B, patterning exposure for forming the plating electrode layers 3b to be stacked on the respective surface electrode layers 3a is performed on the solder resist 5 using a mask 12. Here, the amount of light exposure is set to be smaller than the amount of light exposure at which the solder resist 5 fully reacts to light. For example, the amount of light exposure is set such that the reactivity of the solder resist 5 to light is about 80% to about 90%.

Figure 5C:
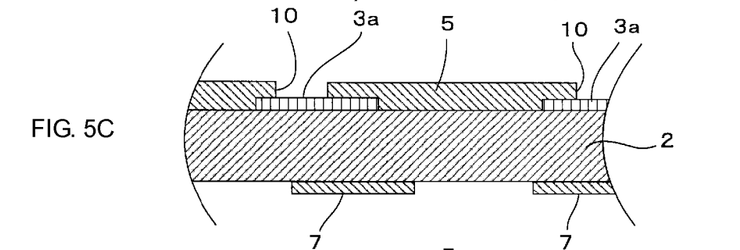

Next, as illustrated in FIG. 5C, the openings 10 are formed in respective regions of the solder resist 5, the regions being located on the respective surface electrode layers 3a, by performing development and after-baking.

Figure 5D:
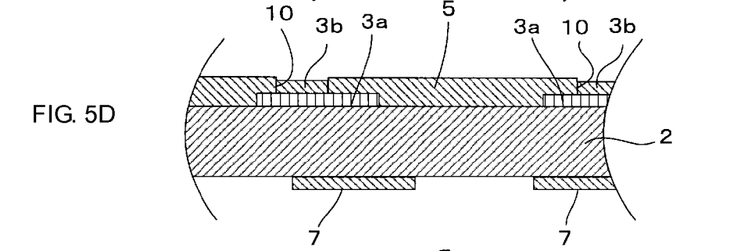
Figure 5E:
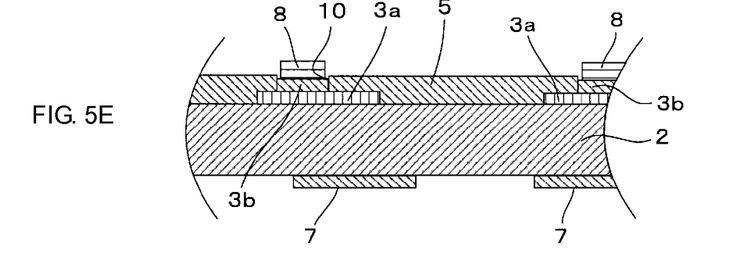

Next, as illustrated in FIG. 5D, the plating electrode layers 3b are formed in the respective openings 10 of the solder resist 5 in the same manner as that in the method for manufacturing the module 1 of the first embodiment (see FIG. 3B). Then, as illustrated in FIG. 5E, the solder 8 is applied to the surfaces of the respective plating electrode layers 3b. The solder 8 is applied also in the same manner as that in the method for manufacturing the module 1 of the first embodiment (see FIG. 3D).

Next, as illustrated in FIG. 6A, in the same manner as that in the method for manufacturing the module 1 of the first embodiment (see FIG. 4A), each component 4 is mounted on predetermined ones of the mounting electrodes 3 on the wiring board 2 and solder-connected to the predetermined ones of the mounting electrodes 3 by heat treatment using a reflow oven or the like. The heat softens unreacted parts of the solder resist 5 which have not reacted to light in the patterning exposure, further condenses the solder resist 5, and forms the recess 9 substantially wedge-shaped in cross section at the boundary between the solder resist 5 and each plating electrode layer 3b.

Next, as illustrated in FIG. 6B, cleaning treatment is performed in the same manner as that in the method for manufacturing the module 1 of the first embodiment. Here, the unreacted parts of the solder resist 5 which have not reacted to light in the patterning exposure are removed. The recesses 9 are deepened by removing the unreacted parts of the solder resist 5. Last, as illustrated in FIG. 6C, in the same manner as that in the method for manufacturing the module 1 of the first embodiment (see FIG. 4B), the sealing resin layer 6 is formed to manufacture the module 1. After the solder resist 5 is formed, the surface of the solder resist 5 may be roughened by plasma treatment (plasma ashing), as in the first embodiment described above.

As described above, the solder resist 5 of negative type is used, and unreacted parts of the solder resist 5 that do not react to light are formed in patterning exposure. Then, by removing the unreacted parts through cleaning treatment, the recess 9 substantially wedge-shaped in cross section is formed at the boundary between the solder resist 5 and the plating electrode layer 3b of each mounting electrode 3. Thus, the module 1 can be manufactured, which can provide the same effect as that in the present embodiment.

Third Embodiment

Figure 7:
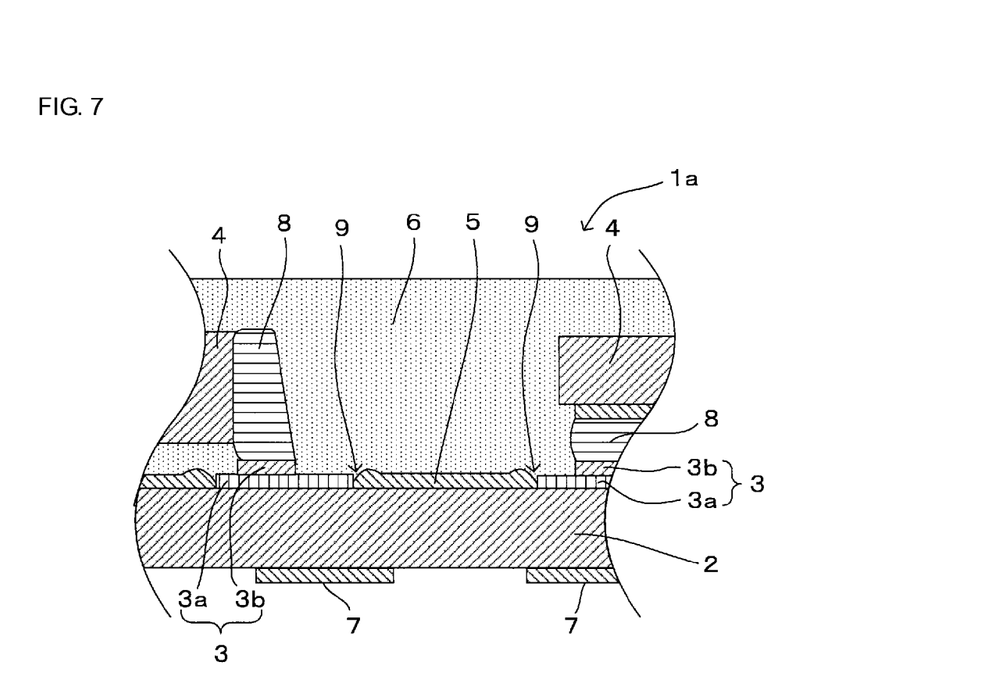
FIG. 7 is a partial cross-sectional view of a module according to a third embodiment of the present invention.

A module 1a according to a third embodiment of the present invention will be described with reference to FIG. 7. FIG. 7 is a partial cross-sectional view of the module 1a.

As illustrated in FIG. 7, the module 1a according to the third embodiment differs from the module 1 of the first embodiment described with reference to FIG. 1 and FIG. 2 in that the module 1a has the recess 9 substantially wedge-shaped in cross section at a boundary between the surface electrode layer 3a of each mounting electrode 3 and the solder resist 5. The other configurations are the same as those of the first embodiment, and their description will be omitted by assigning the same reference numerals to the corresponding components.

In the third embodiment, the recess 9 substantially wedge-shaped in cross section is provided at the boundary between the solder resist 5 and the surface electrode layer 3a of each mounting electrode 3. Even in this case, filling the recess 9 with resin of the sealing resin layer 6 provides an anchor effect, which improves the adhesion strength between the sealing resin layer 6 and the solder resist 5 at the recess 9. This can prevent moisture from penetrating into the interface between the sealing resin layer 6 and the solder resist 5. Even if moisture penetrates into the interface between the sealing resin layer 6 and the solder resist 5 and a gap is created in the interface, since a path of the gap that connects adjacent mounting electrodes 3 is elongated by the presence of the recess 9 as in the module 1 according to the first and second embodiments, it is possible to prevent solder splashes.

The surface electrode layers 3a and the plating electrode layers 3b may be formed such that as viewed in a direction orthogonal to the one principal surface of the wiring board 2, the area of each plating electrode layer 3b is substantially the same as the area of the corresponding surface electrode layer 3a. In this case, the recess 9 may be formed at the boundary between the plating electrode layer 3b and the solder resist 5, with a side face of the surface electrode layer 3a covered with the solder resist 5.

Fourth Embodiment

Figure 8:
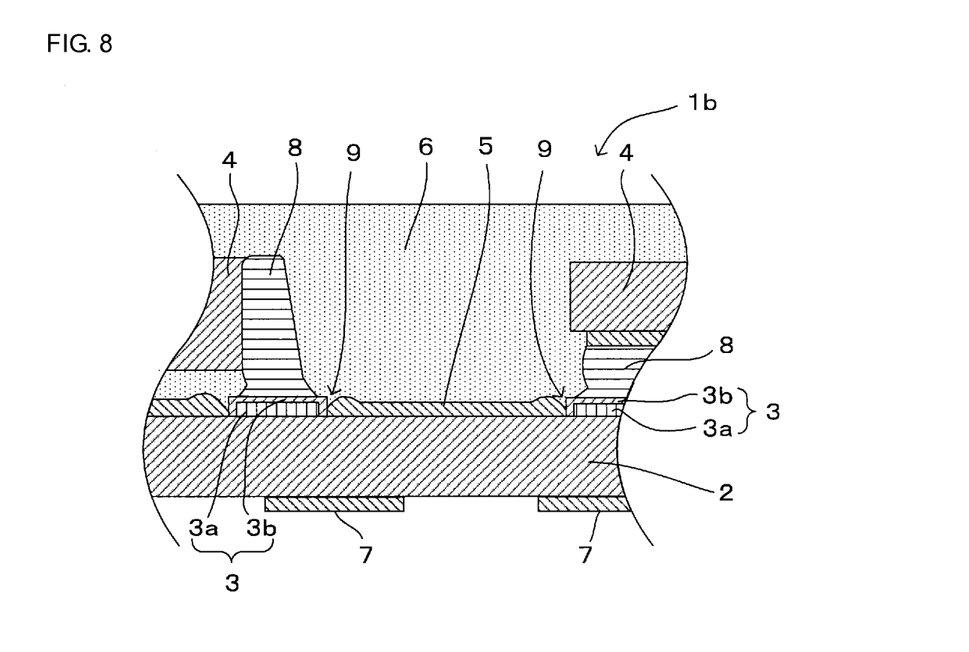
FIG. 8 is a partial cross-sectional view of a module according to a fourth embodiment of the present invention.

A module 1b according to a fourth embodiment of the present invention will be described with reference to FIG. 8. FIG. 8 is a partial cross-sectional view of the module 1b.

As illustrated in FIG. 8, the module 1b according to the fourth embodiment differs from the module 1 of the first embodiment described with reference to FIG. 1 and FIG. 2 in that the plating electrode layer 3b of each mounting electrode 3 covers an outer surface of the surface electrode layer 3a except a surface in contact with the wiring board 2. The other configurations are the same as those of the module 1 of the first embodiment, and their description will be omitted by assigning the same reference numerals to the corresponding components.

In this case, the plating electrode layer 3b covers the outer surface of the surface electrode layer 3a, and the recess 9 substantially wedge-shaped in cross section is provided at a boundary between the solder resist 5 and the plating electrode layer 3b that covers a side face of the surface electrode layer 3a. Even with this configuration, the same effect as that of the module 1 according to the first embodiment can be achieved. Since the surface area of the plating electrode layer 3b becomes greater than that in the module 1 of the first and second embodiments, the area of connection with the component 4 increases, and the strength of connection between the wiring board 2 (mounting electrode 3) and the component 4 increases.

Fifth Embodiment

Figure 9:
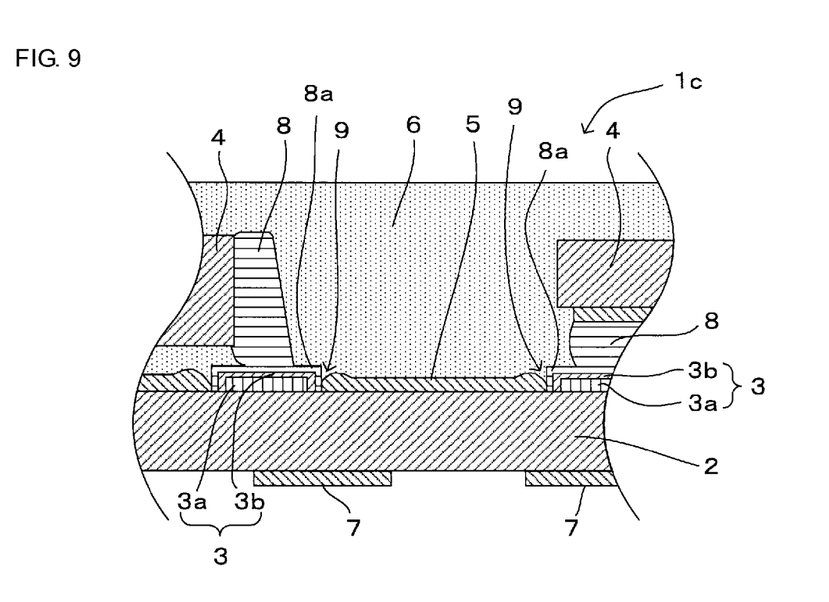
FIG. 9 is a partial cross-sectional view of a module according to a fifth embodiment of the present invention.

A module 1c according to a fifth embodiment of the present invention will be described with reference to FIG. 9. FIG. 9 is a partial cross-sectional view of the module 1c.

As illustrated in FIG. 9, the module 1c according to the fifth embodiment differs from the module 1b of the fourth embodiment described with reference to FIG. 8 in that a surface of each mounting electrode 3 is coated with a solder film 8a. The other configurations are the same as those of the module 1b of the fourth embodiment, and their description will be omitted by assigning the same reference numerals to the corresponding components.

In this case, the surface of the plating electrode layer 3b of each mounting electrode 3 is coated with the solder film 8a, and the recess 9 substantially wedge-shaped in cross section is provided at a boundary between the solder film 8a and the solder resist 5. Even with this configuration, the same effect as that of the module 1b according to the fourth embodiment can be achieved.

The present invention is applicable to various modules in which components are solder-connected to the wiring board.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:
1. A module comprising:
a wiring board;
a mounting electrode for component mounting, the mounting electrode being disposed on one principal surface of the wiring board;
a component mounted on the one principal surface of the wiring board and solder-connected to the mounting electrode;
a photosensitive resin covering the one principal surface of the wiring board with at least a connection surface of the mounting electrode exposed, the connection surface being connected to the component; and
a sealing resin layer disposed on the one principal surface of the wiring board, the sealing resin layer covering the photosensitive resin and the component connected to the mounting electrode,
wherein an edge of the photosensitive resin contacts a side of the mounting electrode and a portion of the photosensitive resin above the edge slopes away from the side of the mounting electrode to form a substantially V-shaped recess at a boundary between the mounting electrode and the photosensitive resin; and
the recess is filled with resin of the sealing resin layer.
2. The module according to claim 1, wherein the mounting electrode has a two-layer structure including
a surface electrode layer disposed on the wiring board, and
a plating electrode layer stacked on the surface electrode layer.
3. The module according to claim 2, wherein as viewed in a direction orthogonal to the one principal surface, an area of the plating electrode layer is smaller than an area of the surface electrode layer; and
the photosensitive resin is positioned to contact the surface electrode layer and define the recess at a boundary of the plating electrode layer.
4. The module according to claim 2, wherein the plating electrode layer covers an outer surface of the surface electrode layer, except a surface in contact with the wiring board.
5. The module according to claim 1, wherein a surface of the mounting electrode is coated with a solder film.
6. The module according to claim 1, wherein a surface of the photosensitive resin is roughened.
7. The module according to claim 1, wherein the wiring board is any one of a resin substrate, a glass epoxy resin substrate, and a ceramic substrate.
8. The module according to claim 1, wherein the photosensitive resin is a solder resist.

* * * * *